United States Patent
Wang

(10) Patent No.: US 11,356,114 B2
(45) Date of Patent: Jun. 7, 2022

(54) R-2R RESISTOR LADDER TRIM CIRCUITS

(71) Applicant: TEXAS INSTRUMENTS INCORPORATED, Dallas, TX (US)

(72) Inventor: Binan Wang, Tucson, AZ (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/192,397

(22) Filed: Mar. 4, 2021

(65) Prior Publication Data

US 2021/0281274 A1   Sep. 9, 2021

Related U.S. Application Data

(60) Provisional application No. 62/984,801, filed on Mar. 4, 2020.

(51) Int. Cl.
*H03M 1/78* (2006.01)
*H03M 1/10* (2006.01)
*H03M 1/68* (2006.01)

(52) U.S. Cl.
CPC ......... *H03M 1/785* (2013.01); *H03M 1/1061* (2013.01); *H03M 1/68* (2013.01)

(58) Field of Classification Search
CPC ....... H03M 1/785; H03M 1/1061; H03M 1/68
USPC .......................................... 341/121, 144–145
See application file for complete search history.

(56) References Cited

U.S. PATENT DOCUMENTS

| | | | |
|---|---|---|---|
| 6,002,354 A * | 12/1999 | Itoh | H03M 1/68 341/144 |
| 10,333,542 B2 * | 6/2019 | Chang | H03M 1/0612 |

* cited by examiner

*Primary Examiner* — Khai M Nguyen
(74) *Attorney, Agent, or Firm* — John R. Pessetto; Charles A. Brill; Frank D Cimino

(57) ABSTRACT

In some examples, a system includes an integrated circuit comprising a transistor, a first amplifier coupled to the transistor, a second amplifier having an output and coupled to the transistor and the first amplifier, and an R-2R resistor ladder having multiple rungs. Each rung is switchably coupled to a terminal of the transistor and to the output of the second amplifier. The R-2R resistor ladder includes a resistor coupled to either the transistor or the output of the second amplifier.

22 Claims, 4 Drawing Sheets

R-2R RESISTOR LADDER TRIM CIRCUITS

CROSS-REFERENCE TO RELATED APPLICATIONS

The present application claims priority to U.S. Provisional Patent Application No. 62/984,801, which was filed Mar. 4, 2020, is titled "On-Chip Current/Voltage Precision Trim Design And Method Using A R2R Ladder," and is hereby incorporated herein by reference in its entirety.

BACKGROUND

Although integrated circuit (IC) manufacturers may use the same equipment and the same designs to produce multiple ICs, the ICs may still differ from each other in subtle ways due to process variations. Manufacturers often use trim circuits during IC testing to fine-tune, or trim, the ICs, thereby mitigating the process variations. These trim circuits may be used on devices that are incorporated into any type of electronic systems. For examples, these systems may include: automotive systems, industrial systems, personal electronic devices, battery-powered devices, computing devices, communications systems, power converters, data converters, sensors, robots and medical equipment.

SUMMARY

In some examples, a system includes an integrated circuit comprising a transistor, a first amplifier coupled to the transistor, a second amplifier having an output and coupled to the transistor and the first amplifier, and an R-2R resistor ladder having multiple rungs. Each rung is switchably coupled to a terminal of the transistor and to the output of the second amplifier. The R-2R resistor ladder includes a resistor coupled to either the transistor or the output of the second amplifier.

DETAILED DESCRIPTION

Figure 1:
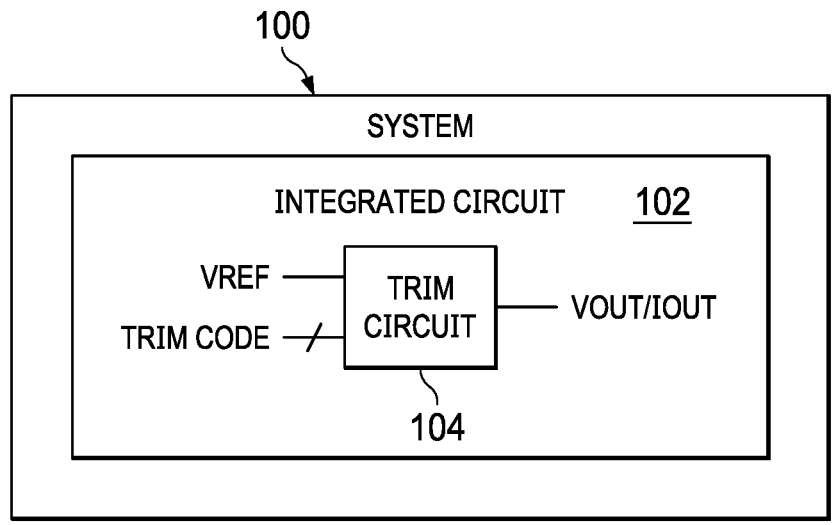
FIG. 1 is a block diagram of a system implementing a trim circuit in accordance with various examples.

Some circuits call for precise voltages or currents. For example, an integrated circuit (IC) may use a bias current of 0.5 milliamperes (mA). Due to process variations, however, the IC may have a measured bias current of 0.4 mA or 0.6 mA, which may be unacceptable for the particular application in which the IC is deployed. Accordingly, the IC may be trimmed using a trim circuit located on the IC so that the bias current is precisely 0.5 mA. Such trimming typically entails the application of a digital code to a set of switches in the trim circuit. The digital code manipulates the switches and other circuitry (e.g., resistors) in the trim circuit in such a manner that the measured bias current is adjusted to 0.5 mA.

This trimming process may be disadvantageous. For instance, the trimming process is tedious and inefficient, because it generally entails repeated current measurements and the application of multiple digital codes until the bias current is precisely tuned to the target value. The iterative nature of the trimming process arises at least in part from the difficulty in predicting the specific adjustments that will occur in response to the application of specific digital codes. For instance, trim steps may be non-linear, so it may be challenging to determine a target digital code without some degree of trial and error. Such problems may arise from resistor mismatches, where different resistors in a trim circuit have different values, thereby resulting in non-linear trim steps. Efforts to correct mismatched resistors entail the use of large and expensive resistors with high resistance values. In addition to these inefficiencies in the trimming process, trim circuits often include large and expensive decoding logic to decode digital codes that are then usable to control the set of switches in the trim circuit.

In some example embodiments, the trim circuit may include a transistor and an amplifier configured to control current flow through the transistor based on a reference voltage and a voltage on a terminal of the transistor. The trim circuit may include an R-2R resistor ladder coupled to the terminal of the transistor with a set of switches. The amplifier may be configured to adjust the current flow through the transistor responsive to a state of the set of switches. An output of the circuit may be based on the current flow through the transistor. Thus, for example, the application of a digital code (or "trim code") to the set of switches may cause the set of switches to assume a state. A voltage provided to an input of the amplifier may change responsive to this state. In an attempt to harmonize the inputs to the amplifier, the amplifier may adjust its output. The amplifier output may control current flow through the transistor. The current flow through the transistor, in turn, may determine an output voltage or current, such as the 0.5 mA bias current described in the example above. In this way, the application of different digital codes to the trim circuit may result in adjustments to (or the trimming of) the output voltage or current. This trim circuit resolves the challenges described above because its well-matched resistors provide linear trim steps, resulting in a fast, efficient, and non-iterative trimming process. In addition, the resistors in the trim circuit have low resistances, thus reducing the costs associated with the use of large resistors. Furthermore, the trim circuit uses no decoding logic to decode digital codes, instead enabling digital codes to directly control a set of switches in the trim circuit. Examples of the trim circuit and their advantages are described below with reference to the drawings.

FIG. 1 is a block diagram of a system 100 implementing a trim circuit in accordance with various examples. More specifically, the system 100 may include an IC 102. The IC 102, in turn, may include a trim circuit 104. Because precision parameters, including voltages and currents, are useful in a broad range of technologies and industries, the system 100 may include virtually any type of system. Examples of the system 100 may include applications such as personal electronics (e.g., smartphones, laptop computers, desktop computers, tablets, notebooks, artificial intelligence assistants), appliances (e.g., refrigerators, microwave ovens, toaster ovens, dishwashers), networking or enterprise-level electronics (e.g., servers, routers, modems, mainframe computers, wireless access points), automobiles and aviation (e.g., control panels, entertainment devices, navigation devices, power electronics), and numerous other electronic systems. The IC 102 may include any type of circuit (e.g., analog circuits, such as amplifiers, data converters, power converters, or digital circuits, such as logic circuits, processors, memory or state machines) within such an electronic system, and, more particularly, the IC 102 may include any type of circuit in which precision parameters may be useful. Examples of the trim circuit 104 are described below with reference to FIGS. 2-5. In each of these examples, the trim circuit 104 may be configured to receive a reference voltage VREF and a digital code (also referred to herein as a "trim code"), and the trim circuit 104 may be configured to provide a trimmed output voltage VOUT or a trimmed output current IOUT.

Figure 2:
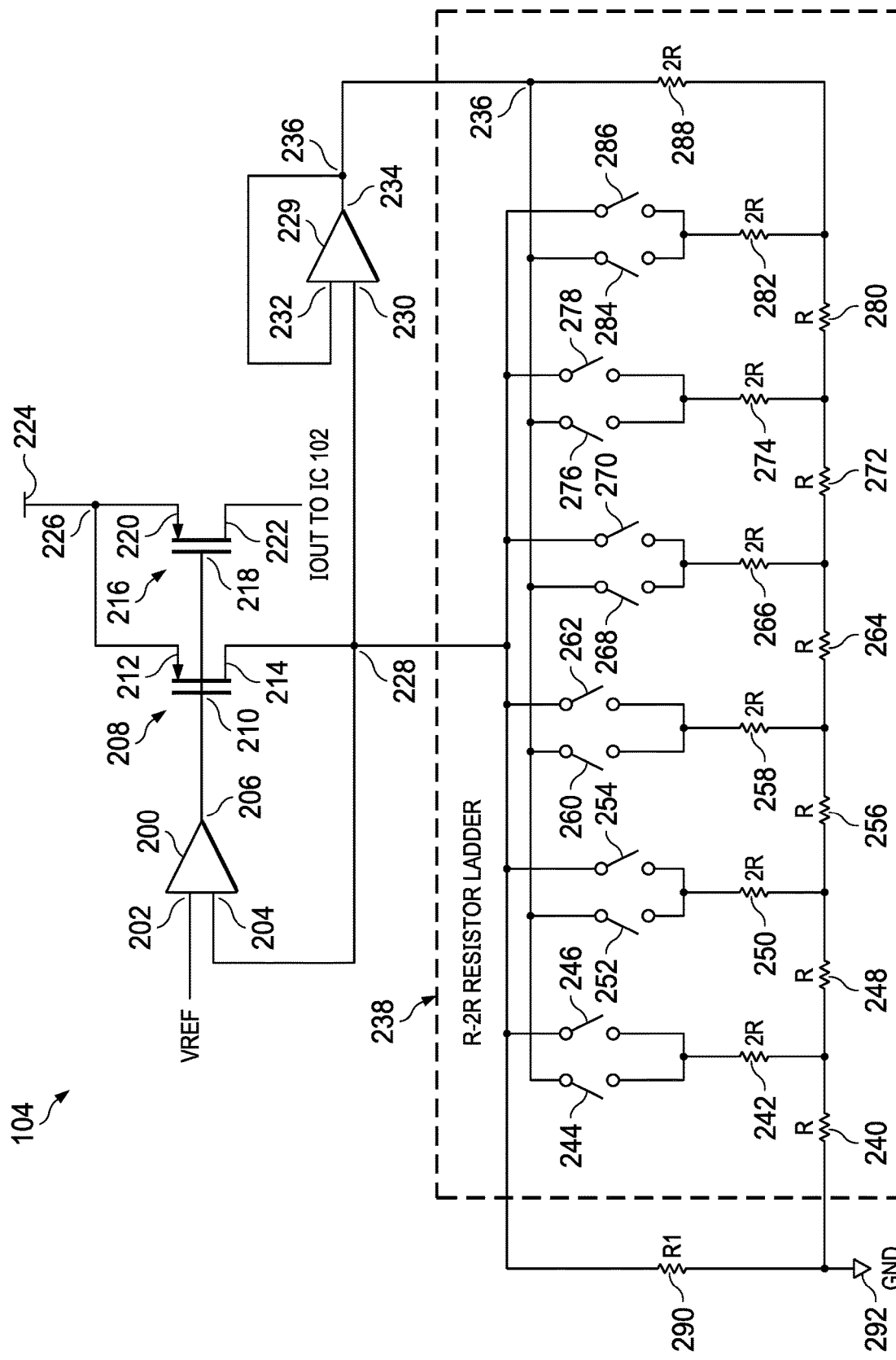
FIG. 2 is a circuit schematic diagram of a trim circuit in accordance with various examples.

FIG. 2 is a circuit schematic diagram of an example trim circuit 104 configured to receive a 6-bit trim code in accordance with various examples. The trim circuit 104 may include an amplifier 200 having inputs 202 and 204 and an output 206. The input 202 may be configured to receive a reference voltage VREF, as FIG. 2 shows. The output 206 may be coupled to a transistor 208. In examples, the transistor 208 may be a field effect transistor (FET), such as a metal oxide semiconductor FET (MOSFET) (e.g., a p-type MOSFET) that includes a gate 210, a source 212, and a drain 214. The output 206 may be coupled to the gate 210. The trim circuit 104 may include a transistor 216. In examples, the transistor 216 may be a FET, such as a MOSFET (e.g., a p-type MOSFET) that includes a gate 218, a source 220, and a drain 222. The gate 218 may be coupled to the gate 210. A voltage source 224 may be coupled to a node 226, and the node 226, in turn, may be coupled to the sources 212 and 220. The input 204 and the drain 214 may be coupled to each other at a node 228. A trimmable output current IOUT is provided through the drain 222. IOUT may be used in the IC 102 as desired.

The trim circuit 104 may include a buffer amplifier 229. The amplifier 229 may have inputs 230 and 232 and an output 234. The input 232 may be coupled to the output 234 in a feedback loop. At a node 236, the output 234 may be coupled to a R-2R resistor ladder 238, also referred to herein as "the ladder." The ladder 238 may include resistors 240 (having, for example, a resistance value of R) and 242 (having, for example, a resistance value of 2R). The resistor 242 may be switchably coupled to the node 228 and the node 236. More specifically, a switch 244 may be configured to couple the resistor 242 to the node 236, and a switch 246 may be configured to couple the resistor 242 to the node 228.

The ladder 238 may also include a resistor 248 that is coupled to the resistors 240 and 242. The resistor 248 may be coupled to a resistor 250, and the resistor 250 may be switchably coupled to the nodes 228 and 236. More specifically, a switch 252 may be configured to couple the resistor 250 to the node 236, and a switch 254 may be configured to couple the resistor 250 to the node 228.

The ladder 238 may also include a resistor 256 that is coupled to the resistors 248 and 250. The resistor 256 may be coupled to a resistor 258, and the resistor 258 may be switchably coupled to the nodes 228 and 236. More specifically, a switch 260 may be configured to couple the resistor 258 to the node 236, and a switch 262 may be configured to couple the resistor 258 to the node 228.

The ladder 238 may also include a resistor 264 that is coupled to the resistors 256 and 258. The resistor 264 may be coupled to a resistor 266, and the resistor 266 may be switchably coupled to the nodes 228 and 236. More specifically, a switch 268 may be configured to couple the resistor 266 to the node 236, and a switch 270 may be configured to couple the resistor 266 to the node 228.

The ladder 238 may also include a resistor 272 that is coupled to the resistors 264 and 266. The resistor 272 may be coupled to a resistor 274, and the resistor 274 may be switchably coupled to the nodes 228 and 236. More specifically, a switch 276 may be configured to couple the resistor 274 to the node 236, and a switch 278 may be configured to couple the resistor 274 to the node 228.

The ladder 238 may also include a resistor 280 that is coupled to the resistors 272 and 274. The resistor 280 may be coupled to a resistor 282, and the resistor 282 may be switchably coupled to the nodes 228 and 236. More specifically, a switch 284 may be configured to couple the resistor 282 to the node 236, and a switch 286 may be configured to couple the resistor 282 to the node 228.

The ladder 238 may include a resistor 288 that may be coupled to the resistors 280 and 282 and to the node 236. In other examples, the resistor 288 may be coupled to the node 228 instead of the node 236. The resistor 288 enables the currents flowing through the individual rungs of the ladder 238 to be binary weighted such that the current through each successive rung from left to right is halved. In some examples, the ladder 238 also may include a resistor 290 that may be coupled to ground 292 and to the node 228.

The ladder 238 includes multiple rungs and legs. The rungs include resistors 242, 250, 258, 266, 274, 282, and 288. The legs include resistors 240, 248, 256, 264, 272, and 280. The numbers of legs, rungs, and pairs of switches in the ladder 238 may depend, at least in part, on the number of trim code bits that are to be provided to the trim circuit 104 to trim an output current (e.g., IOUT) or output voltage of the trim circuit 104. In the example of FIG. 2, a six bit trim code is provided, one to control each pair of switches, as described below.

In some examples, the resistors 240, 248, 256, 264, 272, and 280 may have approximately identical resistances, meaning that none of these resistors has a resistance that varies by more than 10% of the resistance of any other resistor. The resistance of the resistors 240, 248, 256, 264, 272, and 280 is designated herein as R. In some examples, the resistors 242, 250, 258, 266, 274, 282, and 288 may have approximately identical resistances. The resistance of these resistors is designated herein as 2R, which is twice the value of R. In some examples, the resistor 290 may have a resistance of R1, which, in some instances, may be approximately 2R, and in other instances may be approximately R. Other values also may be used for R1. The value of R1 may determine, at least in part, the trim range achievable by the trim circuit 104. For example, selecting a higher value for R1 may result in a larger range of trim values provided by the trim circuit 104, and selecting a lower value for R1 may result in a smaller range of trim values required by the trim circuit 104. The resistor 290 is optional and may be omitted in some examples.

One or more resistors in the trim circuit 104 may include multiple resistors in series. Thus, for instance, the resistor 242, although shown as a single resistor, may actually include two or more resistors coupled in series with each other in the same rung of the ladder 238. Similarly, one or more resistors in the trim circuit 104 may include multiple resistors in parallel. Likewise, one or more resistors in the trim circuit 104 may include multiple resistors arranged in a combination of series and parallel configurations. Regardless of the specific resistor configurations used, the R-2R topology of the ladder 238 mitigates the large costs associated with the use of large resistors in conventional solutions. In addition, the R-2R topology of the ladder 238 provides well-matched resistors that promote predictability and linearity in trim circuit performance, as described below.

Operational principles of the example trim circuit 104 are now described, followed by an example operation scenario.

The amplifier 200 may receive reference voltage VREF on input 202 and another voltage at input 204. The voltage received on the input 204 may vary, depending on the state of the set of switches in the ladder 238. For example, a first trim code may result in a first state of the set of switches, which, in turn, may result in a first current through node 228 and on the input 204. Conversely, a second trim code may result in a second state of the set of switches, which, in turn, may result in a second current through node 228 and on the input 204. The amplifier 200 may be configured to continuously adjust the voltage on the output 206 in an attempt to equalize the voltages on the inputs 202 and 204. Stated another way, because VREF may remain approximately the same, the amplifier 200 may adjust the voltage on the output 206 until the voltage on the input 204 is approximately equal to VREF.

By adjusting the voltage on the output 206, the current flow through the transistor 208 may be manipulated. The changing current flow through the transistor 208 may cause the voltage on the node 228 and the input 204 to change. For instance, responsive to a trim code being applied to the set of switches in the ladder 238 such that the voltage on the input 204 drops slightly below VREF, the amplifier 200 may adjust the voltage on output 206 to manipulate the current flow through the transistor 208 until the voltage on the input 204 rises to VREF. Similarly, responsive to a trim code being applied to the set of switches in the ladder 238 such that the voltage on the input 204 rise slightly above VREF, the amplifier 200 may adjust the voltage on output 206 to manipulate the current flow through the transistor 208 until the voltage on the input 204 converges to VREF. Thus, changing the trim code applied to the set of switches in the ladder 238 may change the current flow through the transistor 208. Because the gates 210 and 218 are tied together and the sources 212 and 220 are tied together, the transistor 216 behaves similarly to the transistor 210. For example, responsive to a rise in the current flow through the transistor 208, the current flow through the transistor 216 may rise, and responsive to a fall in the current flow through the transistor 208, the current flow through the transistor 216 may fall. Thus, the net effect of changing the trim code applied to the set of switches in the ladder 238 is a change, or trim, in IOUT provided by the transistor 216. In examples, the transistor 216 may have different parameters than the transistor 208, such that, responsive to the same gate-source voltages being simultaneously applied to both transistors 208 and 216, the transistor 216 produces a current proportional to that from the transistor 208.

Figure 3:
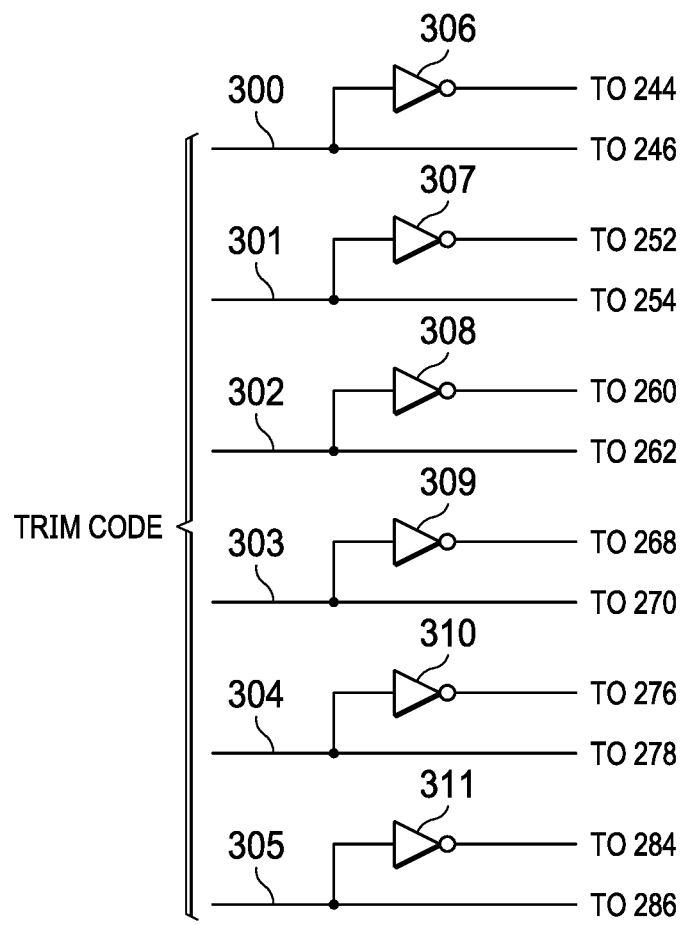
FIG. 3 is a circuit schematic diagram of a portion of a trim circuit in accordance with various examples.

Operational principles of the ladder 238 are now described. At any given time, in each pair of switches, one switch may be open and the other switch may be closed. Thus, for example, when switch 244 is open, switch 246 may be closed, and when switch 244 is closed, switch 246 may be open. Similarly, for instance, when switch 252 is open, switch 254 may be closed, and when switch 252 is closed, switch 254 may be open. Such a switching technique may be achieved by using a bit of the trim code to control one switch in a pair and by using an inverted form of that same bit to control the other switch in the pair. FIG. 3, described below, provides an example of such a switch control topology.

Because of this switching technique, at any given time, each of the switchable rungs (with the exception of the rung with resistor 288, which has a fixed connection to either the node 228 or 236) of the ladder 238 will be coupled to either the node 228 or the node 236. Manipulating the switches so that more rungs are coupled to the node 228 decreases the resistance seen by the node 228, and manipulating the switches so that fewer rungs are coupled to the node 228 (and instead coupled to the node 236) increases the resistance seen by the node 228. When a trim code is applied to the set of switches causing more resistors to be coupled to the node 228 and thus a-lesser resistance to be seen at the node 228, the voltage at the node 228 may be pulled slightly in one direction, thus causing the amplifier 200 to compensate by adjusting the current through the transistor 208. Conversely, when a trim code is applied to the set of switches causing fewer resistors to be coupled to the node 228 and thus a greater resistance to be seen at the node 228, the voltage at the node 228 may be pulled slightly in the other direction, thus causing the amplifier 200 to compensate by adjusting the current through the transistor 208. This is the specific manner by which adjustment of trim codes produces changes in IOUT.

Rungs that are not coupled to the node 228 are coupled to the node 236 rather than simply being disconnected from the remainder of the ladder 238. One reason for this is to continue providing approximately the same voltage (e.g., VREF) through each of the rungs of the ladder 238 regardless of which rungs are coupled to which nodes. (Because amplifier 229 is a buffer, the voltage on node 236 is approximately the same as the voltage on node 228.) By providing approximately VREF across the resistors of each of the rungs in the ladder 238, the currents produced in each of the rungs remains both predictable and evenly distributed. As described above, in conventional solutions, trim steps are non-linear, meaning that equal changes in the trim code applied to conventional trim circuits do not result in equal changes to the current or voltage being trimmed. In the example trim circuit 104, however, the approximately equal resistances R in the legs of the ladder 238 and the approximately equal resistances 2R in the rungs of the ladder 238 result in a ladder topography that produces linear trim steps. Thus, the trim circuit 104 is superior to conventional solutions, because equal changes in the trim code applied to the trim circuit 104 result in approximately equal changes to the current or voltage being trimmed. This linearity in trim steps provides predictability and efficiency when trimming ICs, resulting in shorter manufacturing time and reduced costs.

In examples, the current through the optional resistor 290 is VREF/R1. The total current through the ladder 238 is VREF/2R which may be determined by combining the R and 2R resistors using the Thevenin equivalent circuit technique. As described above, the currents through the rungs of the ladder 238 are binary weighted. Thus, the current through the resistor 242 is $\frac{1}{2}$ of the total current through the ladder 238. The current through the resistor 250 is $\frac{1}{4}$ of the total current through the ladder 238. The current through the resistor 258 is $\frac{1}{8}$ of the total current through the ladder 238. The current through the resistor 266 is $\frac{1}{16}$ of the total current through the ladder 238. The current through the resistor 274 is $\frac{1}{32}$ of the total current through the ladder 238. The current through the resistor 282 is $\frac{1}{64}$ of the total current through the ladder 238. The current through the resistor 288 is $\frac{1}{128}$ of the total current through the ladder 238. The current through each successive rung (from left to right) becomes progressively smaller because the rungs to the right have more leg resistors (e.g., resistors 240, 248, 256, 264, 272, 280) between them and ground 292. For example, the path from the resistor 242 to ground 292 includes only the resistor 240, but the path from the resistor 282 to ground 292 includes resistors 280, 272, 264, 256, 248, and 240, thereby decreasing current. In the event that none of the switches are coupled to node 228, the resistor 290 provides a current pathway to ground 292 so that VREF may be maintained on node 228. Similarly, in the event that none of the switches are coupled to node 236, resistor 288 provides a current pathway to ground 292.

The even distribution of currents through the rungs of the ladder 238 promotes predictable, linear changes in IOUT when different trim codes are applied to the set of switches in the ladder 238. Thus, an engineer or tester responsible for trimming the IC 102 (FIG. 1) may measure IOUT once (e.g., using a dedicated bond pad or pin), determine a suitable trim code, apply the trim code, and skip subsequent measurements. The predictability and linearity in trim steps obviates the need for trial-and-error style trimming.

An example operation of the example trim circuit 104 is now described. A designer, engineer, tester, or other suitable personnel (hereinafter "engineer") may measure IOUT. For example, IOUT may be measured to be 0.4 mA, but IOUT should be 0.5 mA. Thus, IOUT should be trimmed to increase by 0.1 mA. The engineer may calculate the trim code that would result in an increase of 0.1 mA. The calculation may depend on various factors, such as the values of R, 2R, R1, VREF, the voltage provided by voltage source 224, and the sizing ratios of the transistors 208 and 216. The trim code may be easily calculated, however, because of the predictability and linearity of the trim steps, as described above. The engineer may conclude that a trim code of 000001 (resulting in some of the switches 244, 246, 252, 254, 260, 262, 268, 270, 276, 278, 284 and 286 to be open and some to be closed) will cause IOUT to increase by 0.1 mA, for a total IOUT of 0.5 mA. The engineer may close switches 244, 252, 260, 268, 276, and 286 and may leave the remaining switches open. Thus, resistor 282 is coupled to node 228, while the resistors in the remaining rungs of the ladder 238 are coupled to node 236. The resistance seen by the node 228 changes accordingly, resulting in an increase of 0.1 mA in IOUT. Node 236 applies approximately VREF across the resistors in the remaining rungs of the ladder 238, thereby preserving the current ratios in the various rungs as described above.

FIG. 3 is a circuit schematic diagram of a portion of the trim circuit 104 in accordance with various examples. Specifically, FIG. 3 shows a switch control topology that may be useful to control the set of switches in the ladder 238 (FIG. 2). For example, a 6-bit trim code may be applied to terminals 300-305. Each of the 6 trim bits is inverted by a different inverter 306-311. The result is that switches 246, 254, 262, 270, 278, and 286 receive the 6-bit trim code, while the switches 244, 252, 260, 268, 276, and 284 receive the inverse of the 6-bit trim code. In this way, each switch pair in the ladder 238 includes one switch that is open and one switch that is closed. The switch control topology of FIG. 3 is simpler, less expensive, and occupies less space than the large and expensive decode logic used in conventional solutions.

Figure 4:
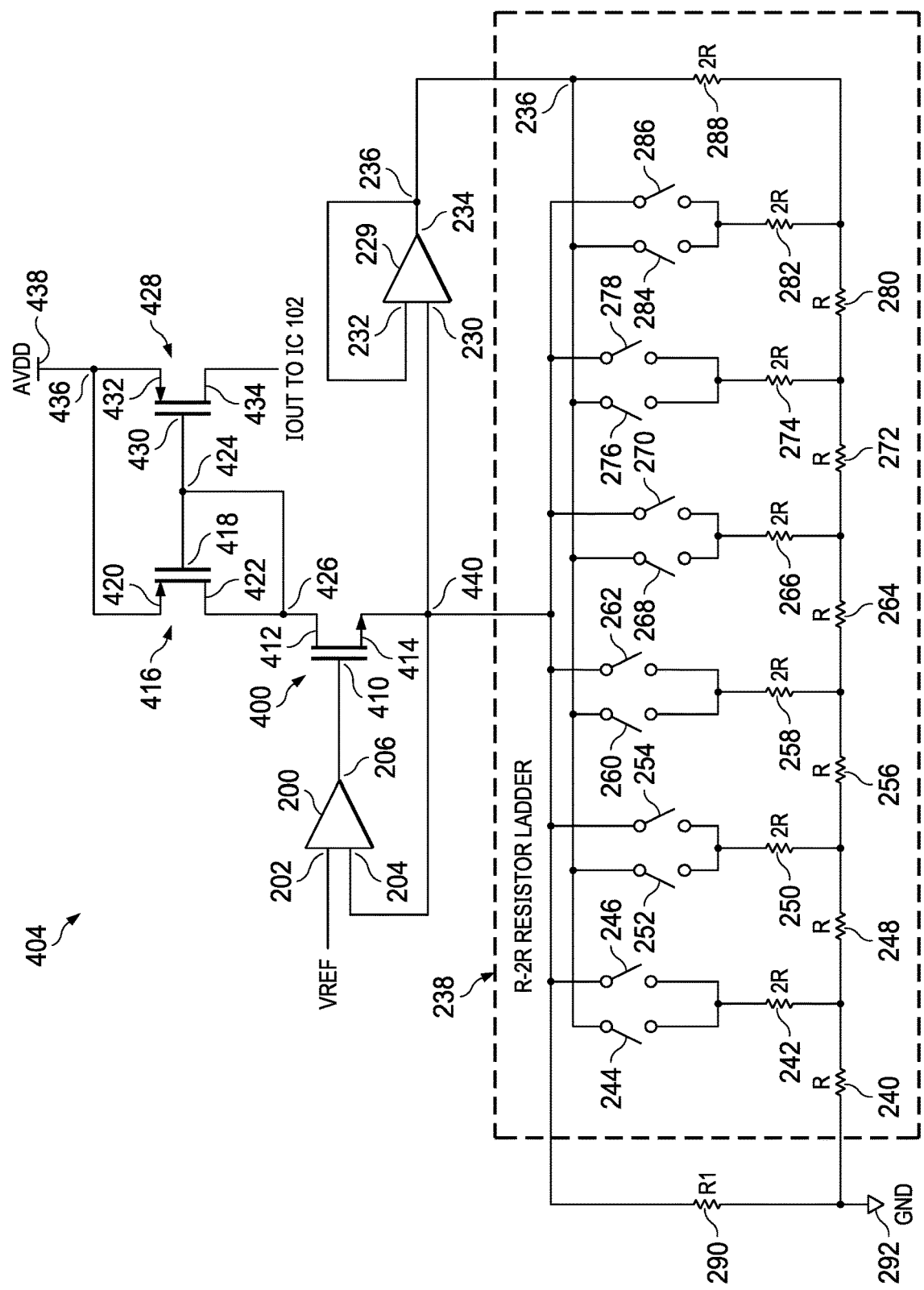
FIG. 4 is a circuit schematic diagram of a trim circuit in accordance with various examples.

FIG. 4 is a circuit schematic diagram of an example trim circuit in accordance with various examples. The example trim circuit 404 of FIG. 4 is similar to the example trim circuit 104 of FIG. 2, except that the trim circuit 404 of FIG. 4 omits the transistors 208 and 216 and instead includes transistors 400 (e.g., an n-type FET), 416 (e.g., a p-type FET), and 428 (e.g., a p-type FET). Transistor 400 includes a gate 410, a drain 412, and a source 414. Transistor 416 includes a gate 418, a source 420, and a drain 422. Transistor 428 includes a gate 430, a source 432, and a drain 434. The drain 412 may be coupled to the drain 422 at a node 426. Node 426 may be coupled to a node 424. Node 424 may be coupled to the gates 418 and 430. The sources 420 and 432 may be coupled to a node 436. The node 436 may be coupled to a voltage source 438. The operation of the example trim circuit 404 of FIG. 4 is largely the same as that of the example trim circuit 104 of FIG. 2, and thus this operation is not described again here. However, the operations of these trim circuits differ in that the trim circuit 404 of FIG. 4 includes a current mirror that is formed by the transistors 416 and 428. Specifically, changes in the current flowing through the transistor 400 (which are analogous to changes in the current flowing through the transistor 208 in FIG. 2) induces changes in the current flowing through the transistor 416. Because the gates 418 and 430 are tied together and the sources 420 and 432 are tied together, the current flowing through the transistor 416 is mirrored by the transistor 428. The current flowing through the transistor 428 may be proportionally related to the current flowing through the transistor 416.

Figure 5:
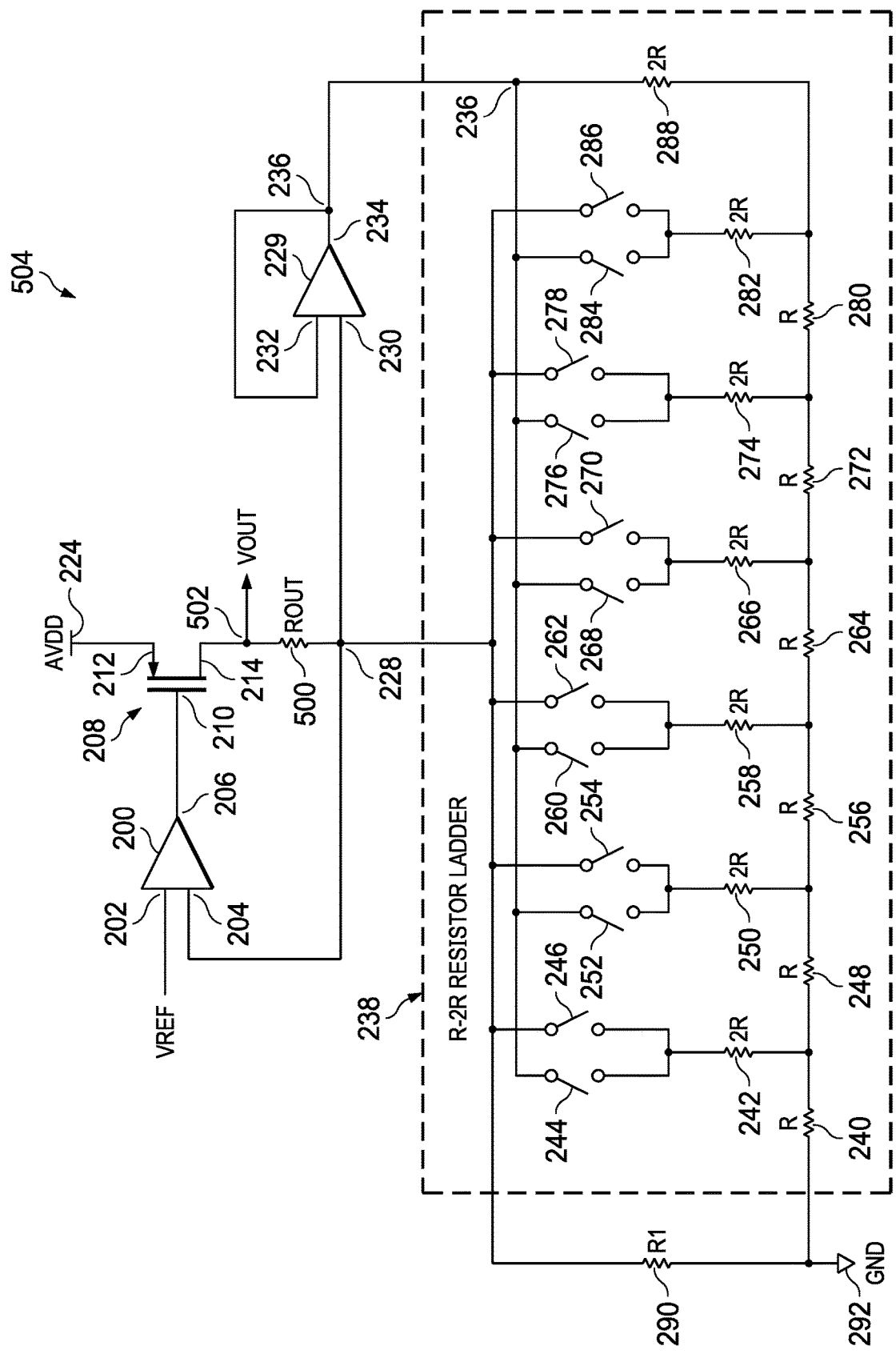
FIG. 5 is a circuit schematic diagram of a trim circuit in accordance with various examples.

FIG. 5 is a circuit schematic diagram of an example trim circuit 504 in accordance with various examples. The structure and operation of the example trim circuit 504 of FIG. 5 are identical to those of the example trim circuit 104 of FIG. 2 and thus are not described in detail here. The trim circuit 504 of FIG. 5 differs from the trim circuit of FIG. 2 in that the trim circuit 504 of FIG. 5 omits the transistor 216 and includes a resistor 500 having a resistance ROUT. The example trim circuit 504 in FIG. 5 may be useful when the parameter to be trimmed is a voltage, rather than a current. The resistor 500 produces a voltage VOUT at node 502. As described above, the current through the transistor 208 varies depending on the trim code applied to the set of switches in the ladder 238. Accordingly, VOUT across resistor 500 varies with this current and produces predictable, linear voltage trim steps that enable efficient trimming processes. The value of VOUT is equal to the product of VREF and (R1+Rout)/R1 summed with the product of Rout and the total current steered into node 228 from the ladder 238.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

While particular transistor structures are referred to above, other transistors or device structures may be used instead. For example, other types of transistors bipolar transistors may be utilized in place of the transistors shown. Additionally, the transistors may be implemented NPN transistors, PNP transistors, pMOSFETs and/or nMOSFETS.

As used herein, the terms "terminal," "node," "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. For example, a resistor or capacitor shown and described herein as a single component may instead be multiple resistors or capacitor, respectively, coupled in series between the same two nodes as the single resistor or capacitor.

Unless otherwise stated, "about," "approximately," or "substantially" preceding a value means+/−10 percent of the stated value. Modifications are possible in the described examples, and other examples are possible within the scope of the claims.

What is claimed is:

1. A system, comprising:
   an integrated circuit, comprising:
   a transistor;
   a first amplifier coupled to the transistor;
   a second amplifier having an output and coupled to the transistor and the first amplifier; and
   an R-2R resistor ladder having multiple rungs, each rung switchably coupled to a terminal of the transistor and to the output of the second amplifier, the R-2R resistor ladder including a resistor coupled to either the transistor or the output of the second amplifier.

2. The system of claim 1, wherein the R-2R resistor ladder includes multiple legs, each of the multiple legs including a different resistor.

3. The system of claim 2, wherein each of the different resistors has an approximately identical resistance R.

4. The system of claim 2, wherein each rung of the R-2R resistor ladder includes a different resistor.

5. The system of claim 4, wherein each of the different resistors has an approximately identical resistance 2R.

6. The system of claim 1, wherein each of multiple rungs of the R-2R resistor ladder includes a different pair of switches, a first switch in the pair of switches coupled to the terminal of the transistor and a second switch in the pair of switches coupled to the output of the second amplifier.

7. The system of claim 1, wherein an input of the second amplifier is coupled to an output of the second amplifier.

8. The system of claim 1, wherein the transistor is a first transistor having a first gate and a first source, and further comprising a second transistor having a second gate and a second source, the first and second gates coupled to each other, and the first and second sources coupled to each other.

9. A circuit, comprising:
   a first amplifier having a first amplifier output, a first amplifier input, and a second amplifier input, the first amplifier input of the first amplifier configured to receive a reference voltage;
   a transistor having a control terminal and a current terminal, the control terminal coupled to the first amplifier output, the current terminal coupled to the second amplifier input of the first amplifier;
   a second amplifier having a second amplifier output, a first amplifier input, and a second amplifier input, the second amplifier output coupled to the first amplifier input of the second amplifier, the second amplifier input of the second amplifier coupled to the current terminal of the first transistor;
   a first set of resistors, each resistor in the first set of resistors switchably coupled to the current terminal and to the second amplifier output;
   a second set of resistors, a different resistor in the first set of resistors coupled in between each consecutive pair of resistors in the second set of resistors; and
   a resistor coupled to the first and second sets of resistors and connected to either the current terminal or to the second amplifier output.

10. The circuit of claim 9, wherein the current terminal is a first current terminal, and further comprising a second current terminal of the transistor and a current mirror circuit coupled to the second current terminal.

11. The circuit of claim 9, wherein each resistor in the first set of resistors has an approximately identical resistance 2R.

12. The circuit of claim 11, wherein the resistor has a resistance of approximately 2R.

13. The circuit of claim 9, wherein each resistor in the second set of resistors has an approximately identical resistance R.

14. The circuit of claim 9, wherein the second current terminal and the second amplified output are configured to produce approximately the reference voltage.

15. A circuit, comprising:
   a transistor having a control terminal and a current terminal;
   an amplifier configured to control current flow through the transistor based on a reference voltage and a voltage on the current terminal of the transistor; and
   an R-2R resistor ladder coupled to the current terminal of the transistor with a set of switches,
   wherein the amplifier is configured to adjust the current flow through the transistor responsive to a state of the set of switches, and wherein an output of the circuit is based on the current flow through the transistor.

16. The circuit of claim 15, wherein the amplifier is a first amplifier, and further comprising a second amplifier coupled to the current terminal of the transistor.

17. The circuit of claim 16, further comprising a first resistor coupled to the transistor and to the R-2R resistor ladder.

18. The circuit of claim 17, further comprising a second resistor coupled to the R-2R resistor ladder and to either of the transistor or the second amplifier.

19. The circuit of claim 15, wherein resistors in rungs of the R-2R resistor ladder have resistances of approximately 2R and resistors in legs of the R-2R resistor ladder have resistances of approximately R.

20. The circuit of claim 15, wherein the R-2R resistor ladder includes multiple rungs configured to carry current in a binary weighted configuration.

21. The circuit of claim 15, wherein the set of switches is configured to selectively steer current from the R-2R resistor ladder through the transistor based on the state of the set of switches.

22. A system, comprising:
   an integrated circuit, comprising:

a transistor;
a first amplifier coupled to the transistor;
a second amplifier coupled to the first amplifier;
a first resistor coupled to the transistor and to the first and second amplifiers; and
an R-2R resistor ladder having multiple rungs, each rung switchably coupled to the first resistor and to an output of the second amplifier, the R-2R resistor ladder including a second resistor coupled to either the first resistor or the output of the second amplifier.

* * * * *